United States Patent
Jeter

(10) Patent No.: US 7,306,490 B1
(45) Date of Patent: Dec. 11, 2007

(54) HIGH-DENSITY PASS-THROUGH FILTER APPARATUS

(75) Inventor: Michael A. Jeter, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/784,038

(22) Filed: Apr. 5, 2007

(51) Int. Cl.
*H01R 13/66* (2006.01)

(52) U.S. Cl. .................................... 439/620.09

(58) Field of Classification Search ........... 439/620.09, 439/620.1, 620.13; 361/300–310, 58, 118
See application file for complete search history.

(56) References Cited

U.S. PATENT DOCUMENTS

| | | | |
|---|---|---|---|
| 4,212,510 A * | 7/1980 | Ritchie et al. ................. | 439/90 |
| 4,641,107 A * | 2/1987 | Kalokitis ..................... | 333/136 |
| 5,057,041 A * | 10/1991 | Yu et al. .................. | 439/620.1 |
| 5,509,825 A * | 4/1996 | Reider et al. .......... | 439/620.09 |
| 5,603,640 A * | 2/1997 | Mouissie ................ | 439/620.09 |
| 5,624,277 A * | 4/1997 | Ward ...................... | 439/620.09 |
| 5,905,627 A * | 5/1999 | Brendel et al. ............. | 361/302 |
| 6,413,119 B1* | 7/2002 | Gabrisko et al. ......... | 439/620.1 |
| 6,529,103 B1* | 3/2003 | Brendel et al. ............. | 361/302 |
| 6,882,248 B2* | 4/2005 | Stevenson et al. .......... | 333/182 |
| 7,046,499 B1* | 5/2006 | Imani et al. ................. | 361/302 |
| 7,136,273 B2* | 11/2006 | Stevenson et al. .......... | 361/302 |
| 7,187,535 B1* | 3/2007 | Iyer et al. .................... | 361/302 |

* cited by examiner

*Primary Examiner*—Briggitte R. Hammond
(74) *Attorney, Agent, or Firm*—Jimmy L. Funke

(57) ABSTRACT

A high-density pass-through filter apparatus slips over the terminal blade of a standard pass-through electrical connector within an opening in the bulkhead of an electronic module to which the connector is fastened. The filter apparatus retains a large number of axially oriented and axially terminated capacitive filter components which are electrically coupled at one end to the connector terminal and at the other end to a peripheral ring that resiliently engages the periphery of the bulkhead opening.

11 Claims, 3 Drawing Sheets

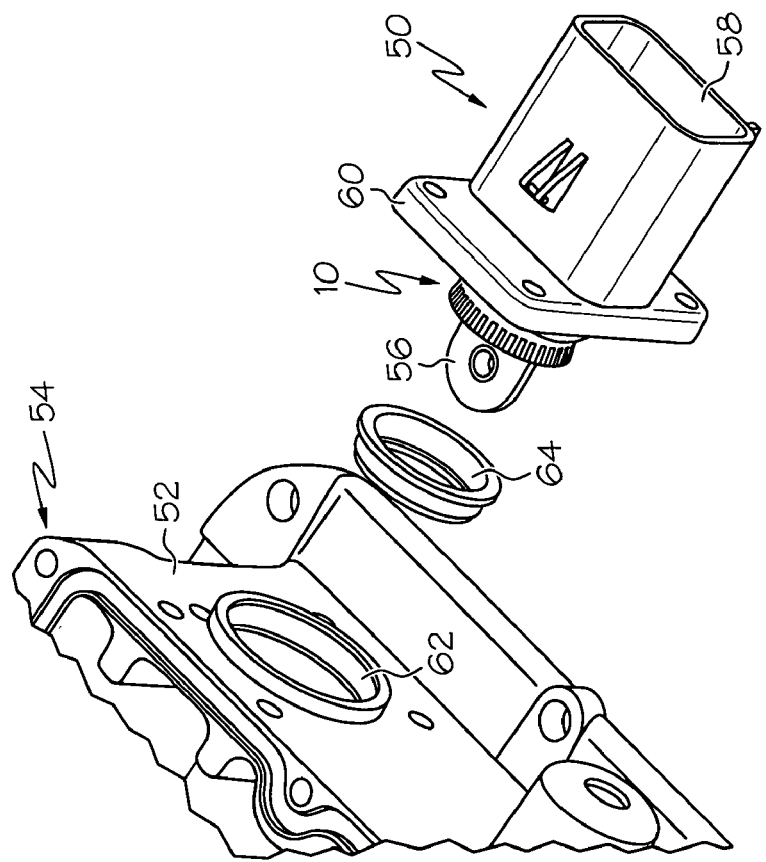
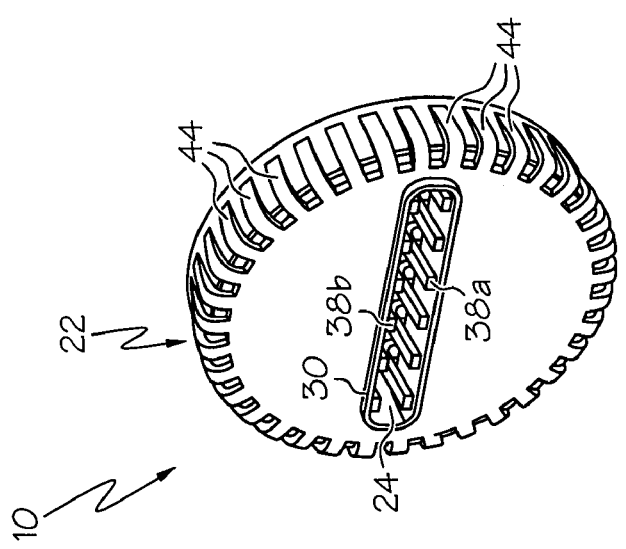
FIG. 3
FIG. 2

HIGH-DENSITY PASS-THROUGH FILTER APPARATUS

TECHNICAL FIELD

The present invention relates to capacitive pass-through filters, and more particularly to high-density pass-through filters for high current pass-through electrical connectors.

BACKGROUND OF THE INVENTION

Pass-through electrical connectors designed to be mounted on the case or bulkhead of an electronic module are frequently provided with capacitive pass-through filter elements for suppressing high frequency energy electromagnetically coupled to the connector terminals or the cables coupled to them. Incorporating the filter components into the connector itself is beneficial from an electrical standpoint because the filter components can be densely packed in relatively close proximity to the connector terminal. However, connectors with integral filter components tend to be both large and costly, particularly in the case of high current connectors. Accordingly, what is needed is a more cost effective way of providing high-density pass-through filtering for electrical connectors.

SUMMARY OF THE INVENTION

The present invention provides an improved high-density pass-through filter apparatus that slips over the terminal blade of a standard pass-through electrical connector within an opening in the bulkhead of an electronic module to which the connector is fastened. The filter apparatus retains a large number of axially oriented and axially terminated capacitive filter components which are electrically coupled at one end to the connector terminal and at the other end to a peripheral ring that resiliently engages the periphery of the bulkhead opening.

BRIEF DESCRIPTION OF THE DRAWINGS

FIG. 2 is a fully assembled isometric view of the filter apparatus of FIG. 1.

FIG. 3 an exploded isometric view of a pass-through electrical connector, the filter apparatus of FIGS. 1-2, an optional grounding ferrule and the metal case of an electronic module.

DESCRIPTION OF THE PREFERRED EMBODIMENT

Figure 1:
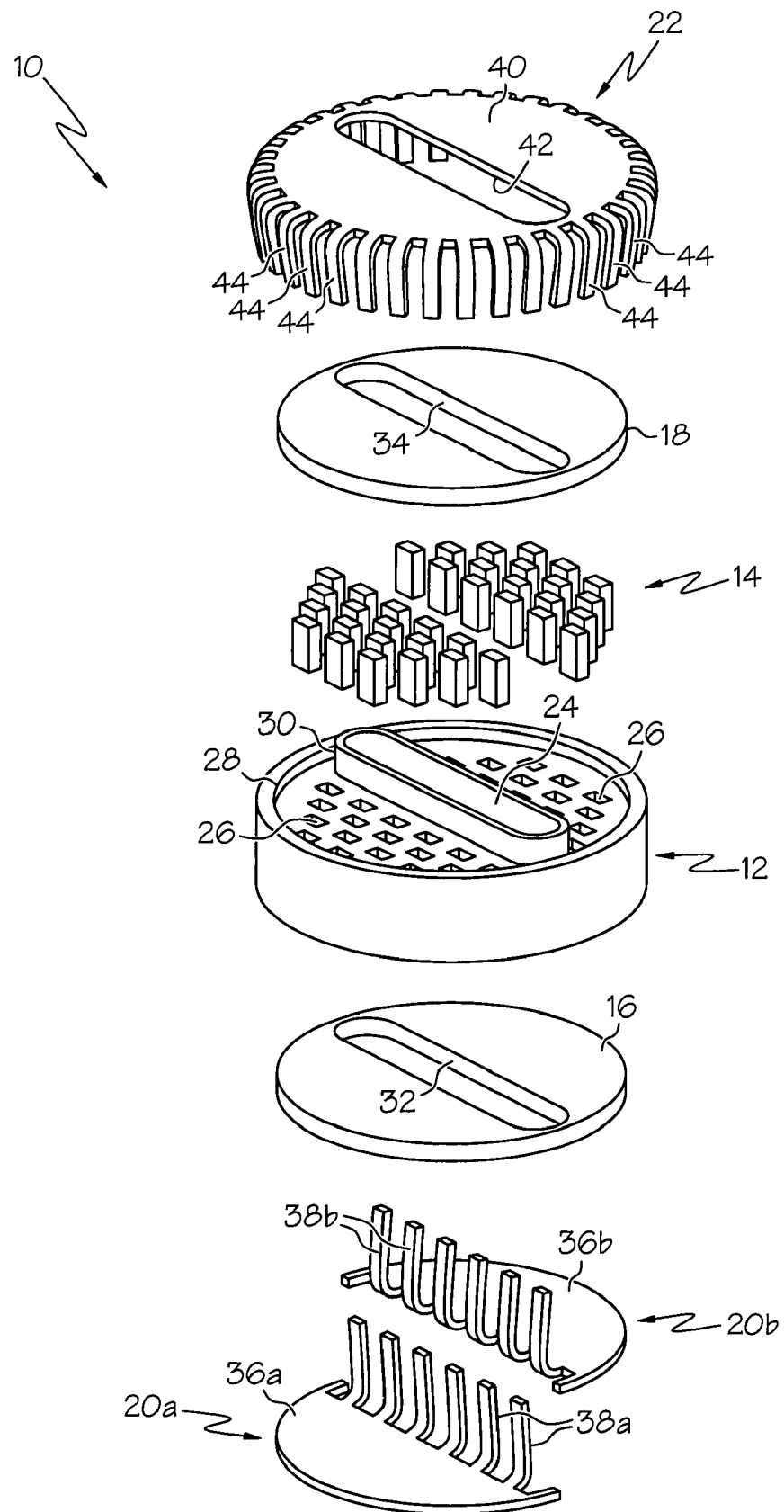
FIG. 1 is an exploded isometric view of the filter apparatus of the present invention.

Referring to the drawings, and particularly to FIGS. 1 and 2, the reference numeral 10 generally designates a preferred embodiment of a high-density pass-through filter apparatus according to the present invention. The filter apparatus 10 of the illustrated embodiment is configured to receive a rectangular connector terminal blade and to fit within a circular bulkhead opening, but it will be appreciated that other configurations are also possible.

As best seen in the exploded view of FIG. 1, the filter apparatus 10 includes an insulative base plate 12, a plurality of axially oriented and axially terminated (i.e., surface-mount) capacitors 14, two conductive pads 16, 18, a set of terminal contactors 20a, 20b, and a bulkhead contactor 22. These components are axially joined as explained below to form the assembled filter apparatus 10 depicted in FIG. 2.

Base plate 12 has a large rectangular axial through-hole 24 sized in cross-section to loosely receive the external terminal of a standard pass-through electrical connector, and a plurality of small square or rectangular axial through-holes 26 sized in cross-section to snugly receive the axially oriented capacitors 14. Additionally, each axial face of base plate 12 includes a raised peripheral shoulder 28 and a raised shoulder 30 surrounding the large rectangular through-hole 24. The capacitors 14 are identical in size, and each has an axial dimension (length) slightly larger than the axial dimension of the base plate through-holes 26.

The conductive pads 16 and 18 are identical, each sized to fit radially within the raised peripheral shoulders 28, and each having a large rectangular axial through-hole 32, 34 sized in cross-section to receive the raised shoulders 30. The conductive pads 16 and 18 are mounted on opposite axial faces of the base plate 12, with the raised shoulders 30 of base plate 12 passing through the respective through-holes 32, 34. When so assembled, the conductive pads 16 and 18 are peripherally bounded by the respective raised peripheral shoulders 28 of base plate 12, and are physically in contact with the terminals formed on opposite axial ends of the capacitors 14. Since the capacitors 14 are each contacted at one end by the conductive pad 16 and at the other end by the conductive pad 18, they are electrically connected in parallel between the two conductive pads 16 and 18. Preferably, conductive pads 16 and 18 are formed of a compliant material such as conductive foam to ensure reliable electrical contact with the terminals of capacitors 14 despite minor variations in the capacitor dimensions. The conductive pads 16 and 18 can be snapped or glued in place within the raised peripheral shoulders 28. Alternatively, the conductive pads 16 and 18 can be formed by dispensing a layer of conductive adhesive, or even solder, on the opposing axial faces of base plate 12.

The terminal contactors 20a, 20b each include a semi-circular base portion 36a, 36b and a linear array of axially extending prongs 38a, 38b. The base portions 36a, 36b of contactors 20a, 20b abut the outboard face of conductive pad 16 within the raised peripheral shoulder 28 of base plate 12, with the prongs 38a, 38b extending into the large rectangular axial through-hole 24 of base plate 12. As explained below, the prongs 38a, 38b electrically contact the external terminal of the electrical connector so that the terminal is electrically connected to each of the capacitors 14 through the conductive pad 16. The contactors 20a, 20b can snap into place within the raised peripheral shoulders 28, or can be held in place with a conductive adhesive. In the case where the conductive pad 16 is formed of conductive adhesive or solder, the conductive pad 16 will serve not only to electrically tie the contactors 20a, 20b to the capacitor terminals, but also to physically secure the contactors 20a, 20b in place.

The bulkhead contactor 22 has a circular base portion 40 with a large rectangular axial through-hole 42 sized in cross-section to receive the raised shoulder 30 of base plate 12, and a circular peripheral array of axially extending prongs 44. The bulkhead contactor 22 is brought into abutment with the conductive pad 18, with the raised shoulder 30 of base plate 12 passing through the through-hole 42.

When so assembled, the prongs 44 engage the radial or lateral periphery of base plate 12, and the bulkhead contactor 22 is electrically connected to each of the capacitors 14 through the conductive pad 18. The prongs 44 and the periphery of base plate 12 can be provided with complementary snap features to mechanically fasten the contactor 22 to the base plate 12. Alternately or in addition, conductive adhesive may be used to secure contactor 22 to the conductive pad 18 and/or base plate 12. And in the case where the conductive pad 18 is formed of conductive adhesive or solder, the conductive pad 18 will serve not only to electrically tie the bulkhead contactor 22 to the capacitor terminals, but also to physically secure the bulkhead contactor 22 in place.

Figure 4:
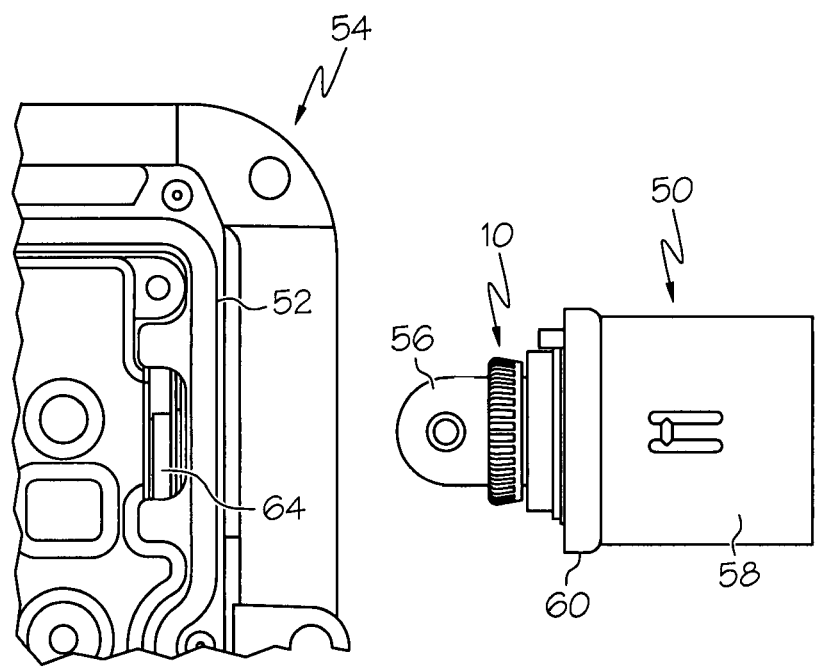
FIG. 4 is a partially assembled isometric view of the electrical connector, filter apparatus, grounding ferrule and module case of FIG. 3.
Figure 5:
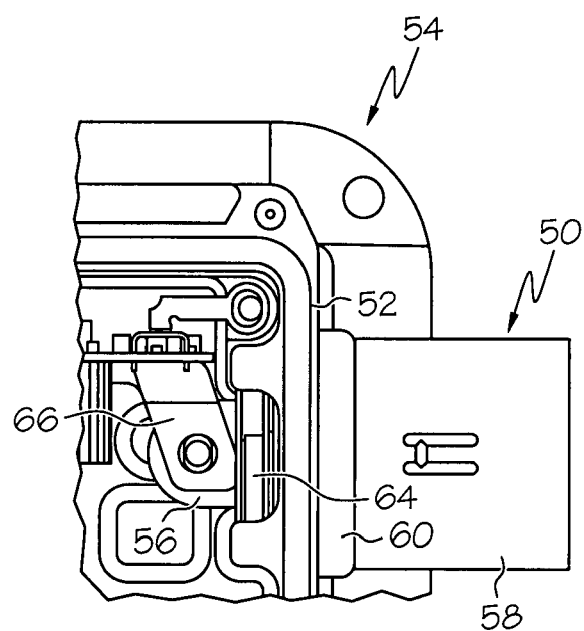
FIG. 5 is a fully assembled isometric view of the electrical connector, filter apparatus, grounding ferrule and module case of FIG. 3.

FIGS. 3, 4 and 5 illustrate an application of the filter apparatus 10 to an electrical connector 50 such as a DC power bus connector that is attached to the sidewall 52 of a cast-metal (aluminum or zinc, for example) housing 54. The plastic body of connector 50 is insert molded around a single electrical terminal having an exposed rectangular blade 56, and includes a header 58 and a mounting flange 60. The filter apparatus 10 is slipped over the terminal blade 56 as seen in FIGS. 3-4, and the peripheral prongs 44 of bulkhead contactor 22 electrically contact the inner periphery of a sidewall opening 62 through which the terminal blade 56 passes when the connector 50 is mounted on sidewall 52 as seen in FIG. 5. In the illustrated embodiment, a grounding ferrule 64 is placed in the opening 62 to serve as an electrical intermediary between the housing 54 and the prongs 44 of bulkhead contactor 22, but the use of grounding ferrule 64 is optional. Once the connector 50 is secured in place on sidewall 52, the inboard end of terminal blade 56 is fastened to a bus structure 66 in housing 54 as shown in FIG. 5.

In summary, the present invention achieves a very cost effective way of providing high-density pass-through filtering for an electrical connector. Packaging the filter apparatus 10 as a component that slips over a terminal blade 56 of a pass-through electrical connector 50 allows the use of an inexpensive standard connector, and the dense arrangement of axially oriented and axially terminated capacitive filter components results in a filter with both low inductive impedance and high capacitance.

While the present invention has been described with respect to the illustrated embodiment, it is recognized that numerous modifications and variations in addition to those mentioned herein will occur to those skilled in the art. For example, the described approach to pass-through filtering may be extended to connectors having more than one terminal, the connector terminal may be round instead of rectangular, and so on. Accordingly, it is intended that the invention not be limited to the disclosed embodiment, but that it have the full scope permitted by the language of the following claims.

The invention claimed is:

1. Filter apparatus for an electrical connector including a terminal blade that passes through an opening in a bulkhead of an electronic module, the filter apparatus comprising:

an insulative base plate slidingly mounted on the terminal blade within the bulkhead opening, the base plate having a plurality of axial though-holes in which are received a plurality of axially oriented and axially terminated capacitive filter components;

a first contactor mounted on a first axial face of the base plate for electrically coupling the terminal blade of the connector to a first axial end of each capacitive filter component; and a second contactor mounted on a second axial face of the base plate opposite said first axial face for electrically coupling a periphery of the bulkhead opening to a second axial end of each capacitive filter component.

2. The filter apparatus of claim 1, where:

the base plate includes a central axial through-hole in which the terminal of said connector is received; and the first contactor includes an array of conductive prongs that extend axially into the central axial through-hole of said base plate and electrically contact said terminal blade.

3. The filter apparatus of claim 1, where:

the second contactor includes an array of peripheral prongs that extend axially along an outer periphery of said base plate and electrically contact the periphery of said bulkhead opening.

4. The filter apparatus of claim 1, further comprising:

a first conductive pad disposed between said first contactor and said base plate for establishing electrical conduction between said first contactor and the first axial ends of said capacitive filter components.

5. The filter apparatus of claim 4, where:

the first conductive pad is formed of conductive foam.

6. The filter apparatus of claim 4, where:

the first conductive pad is formed of a dispensed conductive material.

7. The filter apparatus of claim 4, where:

said insulative base plate includes a raised shoulder peripherally surrounding the first conductive pad and the first contactor.

8. The filter apparatus of claim 1, further comprising:

a second conductive pad disposed between said second contactor and said base plate for establishing electrical conduction between said second contactor and the second axial ends of said capacitive filter components.

9. The filter apparatus of claim 8, where:

the second conductive pad is formed of conductive foam.

10. The filter apparatus of claim 8, where:

the second conductive pad is formed of a dispensed conductive material.

11. The filter apparatus of claim 8, where:

said insulative base plate includes a raised shoulder peripherally surrounding the second conductive pad.

* * * * *